United States Patent [19]
Abe

[11] Patent Number: 5,535,230
[45] Date of Patent: Jul. 9, 1996

[54] ILLUMINATING LIGHT SOURCE DEVICE USING SEMICONDUCTOR LASER ELEMENT

[75] Inventor: Tadashi Abe, Shiroishi, Japan

[73] Assignee: Shogo Tzuzuki, Kanagawa, Japan

[21] Appl. No.: 368,552

[22] Filed: Jan. 3, 1995

[30] Foreign Application Priority Data

Apr. 6, 1994 [JP] Japan ................................ 6-068595

[51] Int. Cl.$^6$ .............................. H01S 3/18; H05B 33/00
[52] U.S. Cl. ................................ 372/43; 372/75; 257/98; 359/326; 362/259; 250/504 R
[58] Field of Search ................................ 257/98; 313/461; 345/82, 83; 348/801; 372/43, 49, 75; 250/504 R, 365; 359/326; 362/259, 260

[56] References Cited

U.S. PATENT DOCUMENTS

| | | | |
|---|---|---|---|
| 3,529,200 | 9/1970 | Potter et al. | 257/98 |
| 3,593,055 | 7/1971 | Geusic et al. | 257/98 |
| 5,012,809 | 5/1991 | Shulze | 128/634 |
| 5,208,462 | 5/1993 | O'Connor et al. | 250/504 R |
| 5,245,623 | 9/1993 | McFarlane | 372/75 |

FOREIGN PATENT DOCUMENTS 416801  4/1992  Japan .

Primary Examiner—Rodney B. Bovernick
Assistant Examiner—Robert McNutt
Attorney, Agent, or Firm—Vickers, Daniels & Young

[57] ABSTRACT

There is disclosed an illuminating light source device suitable for illumination at a vibrating place or a portion where an electric lamp is hardly exchangeable for new one, as well as for general luminairs. The illuminating light source device comprises a semiconductor laser element for outputting a laser beam of a particular wavelength in the range from infrared rays to ultraviolet rays, a lens for diffusing the laser beam from the semiconductor laser element and a fluophor for converting the diffused laser beam from the diffusion lens into visible light. Otherwise, the illuminating light source device comprises a group of semiconductor laser elements for respectively outputting laser beams of three primary colors consisting of red, green and blue, a lens for diffusing the laser beam from each of the semiconductor laser elements, and lenses for superposing the diffused laser beams from the diffusion lenses. Therefore, the illuminating light source device has small power consumption, is excellent in durability and can generate sufficient radiant power output in extreme safety so as to obtain the optimum illumination light such as white light.

10 Claims, 6 Drawing Sheets

ILLUMINATING LIGHT SOURCE DEVICE USING SEMICONDUCTOR LASER ELEMENT

BACKGROUND OF THE INVENTION

1. Field of the Invention

This invention relates to an illuminating light source device using a semiconductor laser which is most suitable for an illuminating light source installed at a vibrating place in a vehicle or tunnel or a portion where an electric lamp is hardly exchangeable for new one, as well as for general luminairs such as room and street lamps and a flash light.

2. Description of the Prior Art

A light source generally for use in illumination includes an incandescent lamp, which can obtain visible light through the heat radiation from an incandesced filament caused by applying current to the filament in a vacuum glass bulb charged with argon gas or the like, and a fluorescent lamp which can convert ultraviolet rays (wavelength of 253.7 nm) resulting from the impaction of thermoelectrons from an electrode filament in a low pressure glass tube of a pressure of about 1 Pa (6 to $10 \times 10^{-3}$ Torr) charged with mercury vapor of a pressure of 1000 Pa (2 to 3 Torr) against mercury atoms, into visible light by irradiating the resultant ultraviolet rays to a fluophor applied to the inside surface of a fluorescent tube.

In addition, the light source described above includes a light emitting diode (which will be referred to as LED thereafter) as a display element used in OA (Office Automation) apparatuses and display units. The LED is adapted to emit light by applying current to p-n junction of a semiconductor. A various kinds of LEDs have been put to practical use and manufactured to be in wide use in the range from infrared rays for use in remote-controlled sensors and optical communication systems to visible light or use in displays by properly selecting the kind and composition of crystal.

A visible radiation LED includes a LED having a luminescent layer such as GaAlAs (660 nm: red), GaAsP (N dope) (590 nm: yellow), GaP (555 nm: green), SiC (470 nm: blue) and GaN (450 nm: blue). A visible radiation LED having high luminance available from red to less-developed blue has been obtained at low cost.

However, the incandescent lamp involves the following problems. Namely, since the current is nearly lost as heat and part of the current is radiated as light, the incandescent lamp is inferior in luminous power conversion efficiency. In addition, the incandescent lamp has large power consumption, and is weak in vibrations or the like and inferior in durability (average service life of a usual illuminating lamp is about 1000 hours.).

On the other hand, although the fluorescent lamp generates nearly no heat in comparison with the incandescent lamp and has satisfactory luminous power conversion efficiency, it still involves the following problems. Namely, the fluorescent lamp has large power consumption and is inferior in durability (the average service life is about 10000 hours). In addition, the fluorescent lamp is difficult to be miniaturized.

Further, the LEDs having various colors have been put into practical use as the visible radiation LED which is advantageously inexpensive and has small power consumption. However, the visible radiation LED generates weak radiant power output and is difficult to be adapted for illumination.

Incidentally, a portable illuminating device such as a flash light and a search light has been proposed as an illuminating light source device using a semiconductor laser (e.g., Japanese Utility Model Laid-open No. 4-16801 or the like). The portable illuminating device uses a visible radiation semiconductor laser as a light source and is adapted to obtain a divergent luminous flux by diffusing visible light from the semiconductor laser through a concave diffusion lens. However, since the semiconductor laser outputs coherent monochromatic light and cannot obtain white light for use in illumination differently from the case of the incandescent lamp and the fluorescent lamp, it involves a problem in that only red or green monochromatic light can be obtained by the semiconductor laser. Further, the semiconductor laser for red or green monochromatic light generates insufficient radiant power output for the present time, and cannot be utilized for illumination as it is.

SUMMARY OF THE INVENTION

It is an object of the present invention to provide an illuminating light source device using a semiconductor laser, which has small power consumption, is excellent in durability and generates sufficient radiant power output in extreme safety to obtain the optimum illumination light such as white light.

According to the present invention, a semiconductor laser element which has been applied to telecommunication, medical care, machine tools and civil engineering survey or the like is adapted for illumination. An illuminating light source device using a semiconductor laser as a first invention comprises a semiconductor laser element for outputting a laser beam having a particular wavelength in the range from infrared rays to ultraviolet rays; a lens for diffusing the laser beam from the semiconductor laser element, and a fluophor for converting the diffused laser beam from the diffusion lens into visible light.

An illuminating light source device using a semiconductor laser as a second invention comprises a group of semiconductor laser elements for respectively outputting laser beams of three primary colors consisting of red, green and blue; a lens for diffusing the laser beam outputted from each of the semiconductor laser elements; and lenses for superposing the diffused laser beams from the diffusion lenses.

Either of AC and DC power sources may be used as a required power source. In case of using the AC power source, a rectifying device may be incorporated in a lighting circuit, or the semiconductor laser element and the lighting circuit may be integrated in a single chip.

The semiconductor laser element corresponds to a double hetero junction semiconductor laser and may have a single stripe structure. However, in order to obtain higher radiant power output, use may be made of a semiconductor laser of phased array type, in which a stripe is divided into a plurality of narrow stripes. Further, a reflection member may be provided on a cleaved facet on one side of an active layer of the semiconductor laser element, an optical guide layer may be thickened or a quantum well structure may be adopted.

Furthermore, mercury atoms or rare earth substances may be doped in the active layer of the semiconductor laser element so as to obtain each color in the range from ultraviolet rays to the visible light. In addition, a second harmonic generation medium may be provided on the output side of the semiconductor laser element to obtain a laser beam having a short wavelength.

In the constitution described above, according to the light source device of fluophor utilization type as the first invention, a small-diameter laser light beam from the semiconductor laser element is diffused through the lens and irradiated to the fluophor, and the light having the wavelength in the range from the ultraviolet rays to the infrared rays can be converted into the visible light by the fluophor.

According to the light source device of three-color superposition type as the second invention, the red, green and blue laser light beams from the respective semiconductor laser elements are superposed while being diffused through the lenses to obtain white light.

In the light source device of any of the types described above, the luminous intensity required for illumination can be obtained by arranging a plurality of semiconductor lasers even having such a single stripe structure as to generate relatively low radiant power output. When the semiconductor of phased array type or the reflection member as described above is adopted, it is possible to obtain the illumination having high luminous intensity by arranging a smaller number of semiconductor lasers.

Since the present invention is constituted as described above, the following effects can be obtained.

(1) Small power consumption will suffice for the present invention to result in energy saving. For instance, 2 V of voltage and 20 mmA of current will suffice for a single unit of the single stripe structure.

(2) The useful life longevity of the present invention becomes approximately 5 times as much as that of a mercury lamp which is considered to have the longest useful life longevity of all the presently available products. For instance, the useful life longevity of a single unit of the single stripe structure is 5 to 100,000 hours, so that the light source device of the present invention is most suitable for illumination at a portion where an electric lamp is hardly exchangeable for new one.

(3) The semiconductor laser element is of small size, rigid, hardly disconnected, and excellent in durability. Thus, the semiconductor laser element is most suitable for illumination at a vibrating place.

(4) Since the voltage is low, the light source device of the present invention is extremely secure against a fire and far safer than the conventional light source device.

(5) Since the current is converted from AC into DC, flickering dose not occur, and there is no possibility of exhausting eyes any more.

BRIEF DESCRIPTION OF THE DRAWINGS

The foregoing and other objects and features of the invention will become apparent from the following description of preferred embodiments of the invention with reference to the accompanying drawings, in which:

FIG. 1 is a schematic sectional view showing an illuminating light source device according to the present invention, wherein

FIG. 2(a) is a schematic sectional view showing a semiconductor laser element doped with mercury or the like;

DETAILED DESCRIPTION OF THE PREFERRED EMBODIMENTS

Figure 1A:
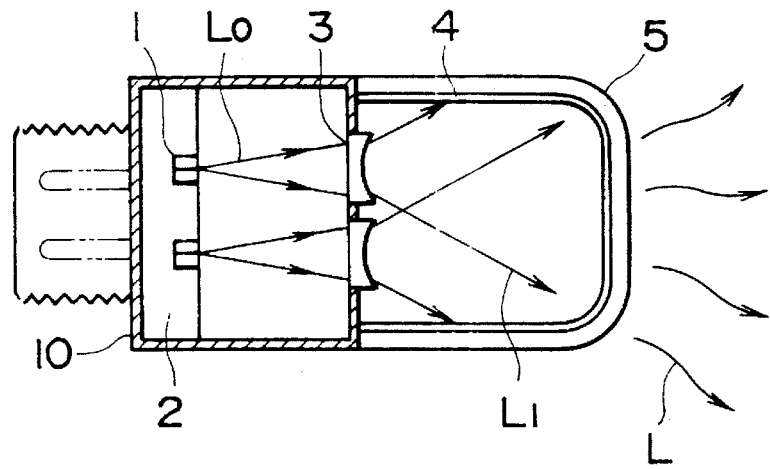
FIG. 1(a) shows a light source device of fluophor utilization type.
Figure 1B:
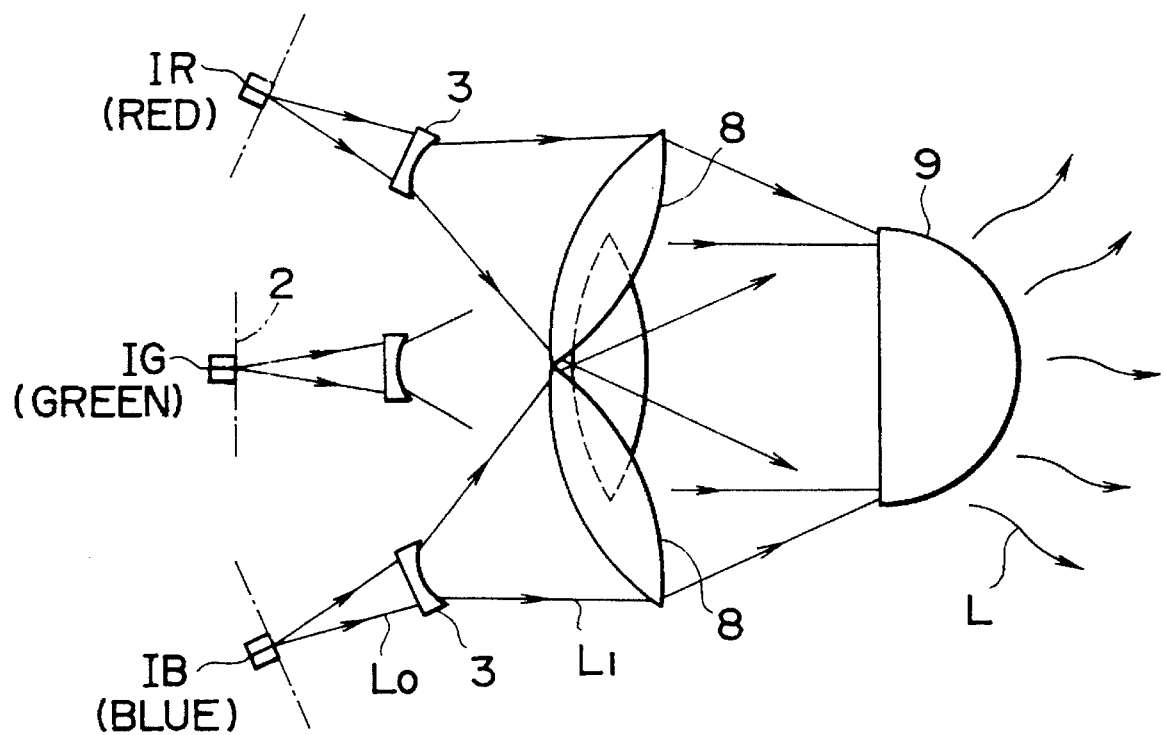
FIG. 1(b) shows a light source device of three-color superposition type.

An illuminating light source device using a semiconductor laser according to the present invention shown in FIG. 1(a) is of fluophor utilization type, and that shown in FIG. 1(b) is of three-primary color superposition type.
(Fluophor utilization type)

Referring to FIG. 1(a), a plurality of semiconductor laser elements 1 are buried in or mounted on a heat sink (radiator) 2, a diffusion lens 3 is arranged in front of each semiconductor laser element 1. In addition, a fluophor 4 is provided on the inside wall surface of a vacuum glass tube 5 charged with argon gas or the like. A laser beam $L_0$ emitted from each semiconductor laser element 1 is diffused through the diffusion lens 3, and the fluorescent material of the fluophor 4 is excited by the diffused light $L_1$ to obtain visible light L.

Figure 5:
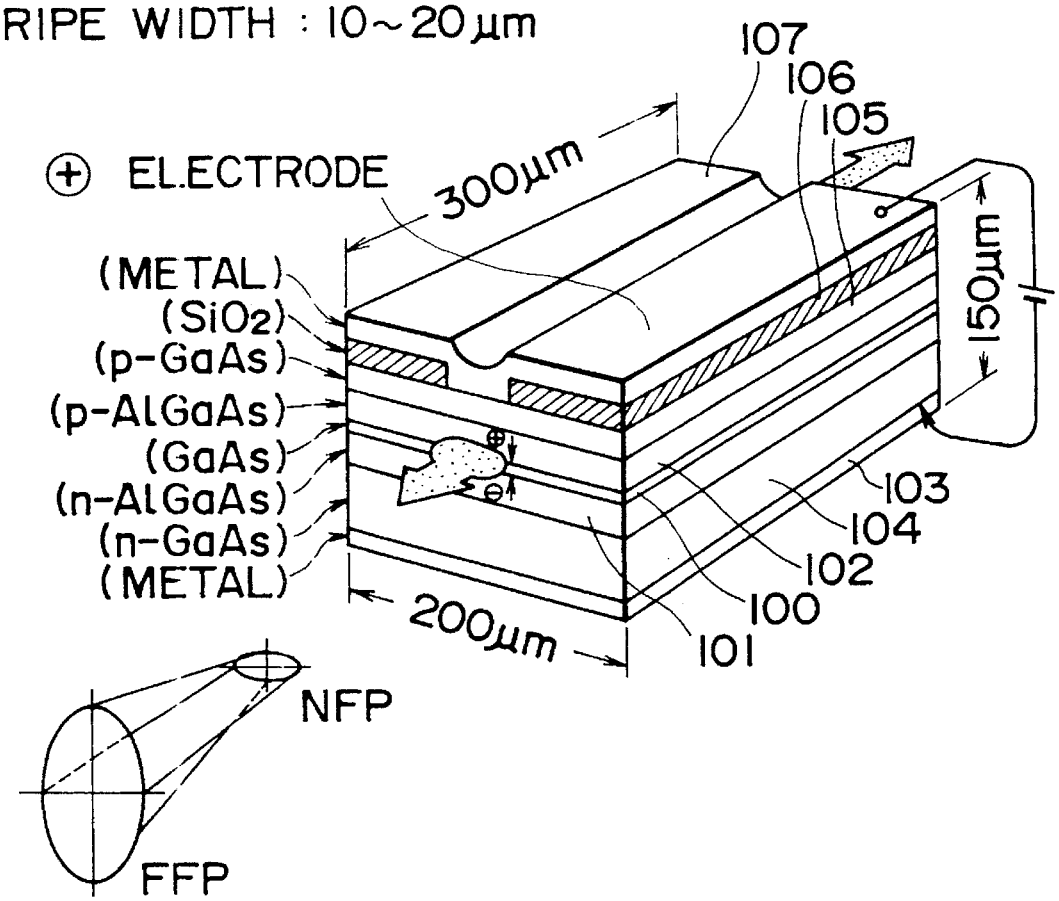
FIG. 5 is a perspective view showing the structure of a semiconductor laser element having a general single stripe structure.

While the structure of the semiconductor laser element 1 will be described later, the semiconductor laser element generally comprises an active layer (luminous layer) 100, clad layers 101, 102, and a substrate 103 as shown in FIG. 5. The crystal structure having the optimum wavelength for the conversion into visible light due to the fluophor 4 is selected in the range from the infrared region to the ultraviolet region by the oscillation wavelength.

The crystal structures of the semiconductor laser element 1 as shown in Table 1 are put into practical use. Preferably, use is made of the crystal structure which stably and continuously oscillates at room temperature to generate relatively high radiant power output, such as $Al_xGa_{1-x}As$ in 0.7 μm band and 0.8 μm band, $In_{1-x}Ga_xAs_yP_{1-y}$ in 1 μm band, and $(Al_xGa_{1-x})In_{0.5}P_{0.5}$ in 0.6 μm band.

Further, since the semiconductor laser element 1 in the short-wavelength region from blue to ultraviolet rays involves a problem in that the life of continuous oscillation is short at room temperature under the present conditions, it is possible to use a semiconductor laser element 1 having the structure as follows.

Figure 2A:
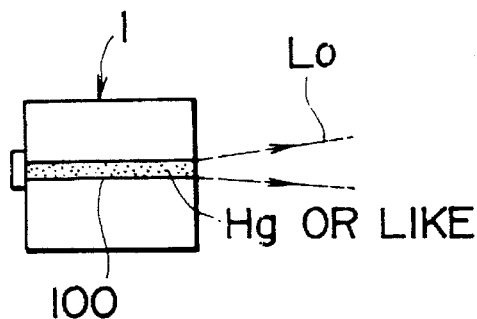

A semiconductor laser element as shown in FIG. 2(a) is arranged such that mercury atoms Hg are doped into the active layer 100 of the semiconductor laser element 1 of 0.8 μm band or the like enabling to generate relatively high radiant power output by charging the active layer with mercury vapor gas at the time of producing the active layer. In this case, the light in the active layer 100 is converted into the ultraviolet rays due to the mercury atoms Hg, and the laser beam having the wavelength in the ultraviolet region can be outputted. In addition, the visible light of each color or the laser beam having the wavelength in other region can be outputted by doping a rare earth substance, instead of the mercury atom.

As for the crystal growth method, there have been adopted new methods such as liquid phase epitaxy for precipitating the crystal to be made growth from an oversaturated or fused solution, vapor phase epitaxy for supplying a material as vapor or gas and then depositing the supplied material on a heated substrate through decomposition and synthesis reactions, molecular beam epitaxy and hot wall epitaxy. However, optical epitaxy for irradiating a laser beam to a gas material and then depositing the resultant vapor on a substrate, for example, can be adopted as a method for doping mercury or the like in the active layer.

Figure 2B:
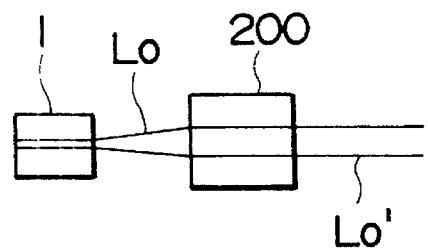
FIG. 2(b) is a schematic sectional view showing a semiconductor laser element provided with SHG element.

As shown in FIG. 2(b), it may be possible to obtain light in the range from blue to ultraviolet rays by using the semiconductor laser element 1 of 0.8 μm band enabling to generate relatively high radiant power output and a SHG (Second Harmonic Generation) element 200 having a wave guide. When lithium tantalum crystal having a polarization reverse layer is used as the SHG element 200, for example, the laser beam having a wavelength of 870 nm and output of 140 mW can be converted into blue light having a wavelength of 435 nm and output of about 10 mW.

The fluorescent material of the fluophor 4 includes materials as shown in Table 2, for example, and the optimum fluorescent material is selected depending on the oscillation wavelength of the semiconductor laser element 1 to be used.

semiconductor laser elements become inoperative. As a result, the semiconductor laser elements are connected in parallel or in combination of parallel and series.

When the semiconductor laser element has the single stripe structure which will be described later, the diffusion lens 3 is adapted to enlarge such a small-diameter laser beam that has a beam size of laterally elongate ellipse of 1×3 μm (AlGaAs: wavelength of 0.78 μm) at a near field point (NEP), and spreads at a divergent angle of about 15° C. (lateral) and 45° C. (vertical) to give a far field point (FFP) of a laterally elongate ellipse (See FIG. 5), while having a small diameter.

Accordingly, a concave lens is preferably used as the diffusion lens 3. The diffusion lens 3 is made of quartz glass having high refractive index and small optical loss, and arranged at a predetermined distance from the semiconductor laser element. In addition, lanthanum or the like having small optical loss may be added to a quartz glass material to enhance the refractive index. Incidentally, cerium or the like is used as an abrasive for polishing the lens in the manufacturing process.

Figure 4A:
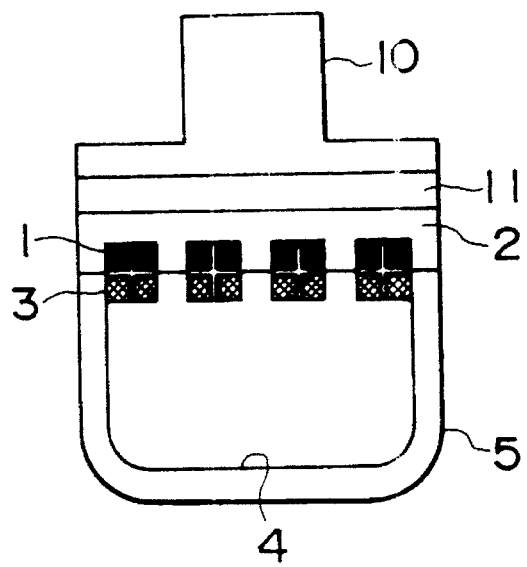
FIG. 4 is a schematic sectional view showing various configurations of an illuminating light source device according to the present invention.

The illuminating light source device itself may be provided in the form of a light bulb or a fluorescent lamp. The light source device shown in FIG. 4(a) is provided in the form of a light bulb, in which a heat sink 2 is mounted on a socket portion 10 and a plurality of semiconductor laser elements 1 are mounted on the heat sink 2. In this case, the semiconductor laser element 1 usually has a size of about 0.4 mm square. When the light bulb has a normal size, it is possible to mount 12 pieces of semiconductor laser elements on the heat sink.

In addition, a lighting circuit 11 including an AC-to-DC converter can be incorporated in the heat sink 2. In this case, an optical element and an electronic element are integrated in a single chip. Furthermore, a plurality of semiconductor laser elements 1 can be incorporated on a single chip. In this case, the diffusion lens 3 may be constituted as one lens or a plain micro-lens obtained by two-dimensionally arraying (i.e., arranging in a matrix form) fine lenses corresponding to the semiconductor laser elements.

Figure 4B:
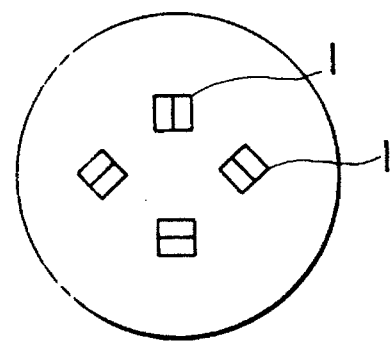

Incidentally, since the laser beam of the semiconductor laser element 1 having the single stripe structure is elliptical and has directivity as described above, the directivity of the laser beam is nearly made lost by varying the directivity through each element 1, as shown in FIG. 4(b). Further, in case of a semiconductor laser element of phased array type which will be described later, the semiconductor laser elements are arranged by similarly varying the array direction thereof.

TABLE 1

DOUBLE HETERO JUNCTION SEMICONDUCTOR
LASER CRYSTALS AND OSCILLATION WAVELENGTH

| GROUP | ACTIVE LAYER | CLAD LAYER | SUBSTRATE | OSCILLATION WAVELENGTH (μm) |
|---|---|---|---|---|
| ZnSeS | ZnSeTe | GaP | 0.35–0.4 | (ultraviolet–violet) |
| ZnSeS | ZnSeTe | GaAs | 0.4–0.45 | (violet–blue) |
| ZnCdSe | ZnSSe | GaAs | 0.49–0.53 | (blue–blue green) |
| ZnSeTe | ZnSeTe | InP | 0.5–0.6 | (green) |
| AlGaInP | AlGaInP | GaAs | 0.55–0.7 | (yellow–red) |
| InGaAsP | AlGaAs | GaAs | 0.64–0.9 | (red infrared) |
| AlGaAs | AlGaAs | GaAs | 0.7–0.9 | (infrared) |
| InGaAsP | InP | InP | 0.9–1.8 | (infrared) |
| GaInAsSb | GaInAsSb | GaSb | 1.8–4.3 | (infrared) |
| PbEuSeTe | PbEuSeTe | PbTe | 2.5–6.5 | (infrared) |
| PbSnSeTe | PbSeTe | PbSnTe | 5.5– | (infrared) |

TABLE 2

FLUORESCENT SUBSTANCES AND LIGHT SOURCE COLORS

| FLUORESCENT SUBSTANCE | LIGHT SOURCE COLOR |
|---|---|
| Calcium tungstate | Blue |
| Magnesium tungstate | Bluish white |
| Zin silicate | Green |
| Calcium halophosphate | White (daylight color) |
| Zinc beryllium silicate | Yellowish while |
| Calcium Silicate | Yellowish red |
| Cadmium borate | Red |

Figure 3A:
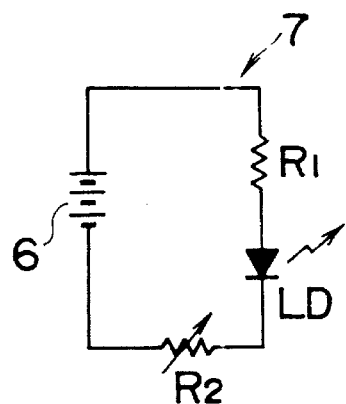
FIG. 3 is a circuit diagram showing a power source and a lighting circuit.
Figure 3B:
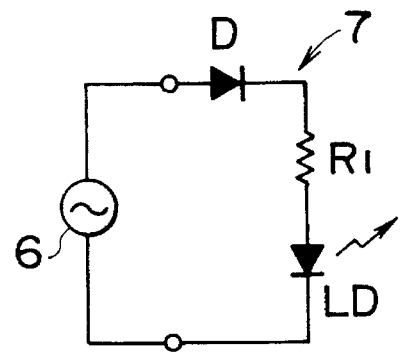
Figure 3C:
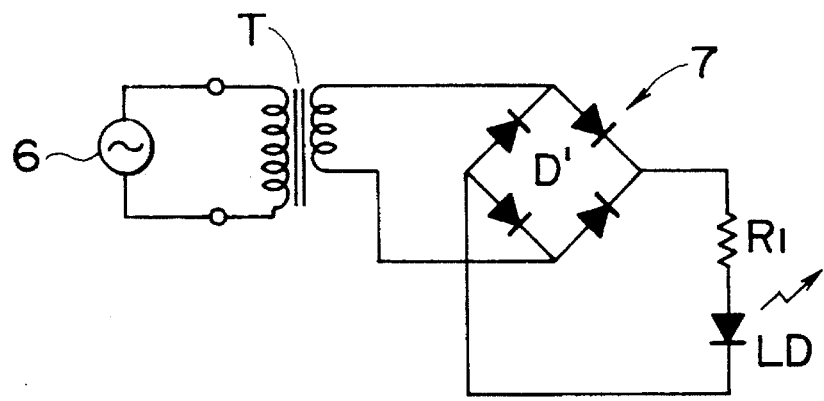
Figure 4C:
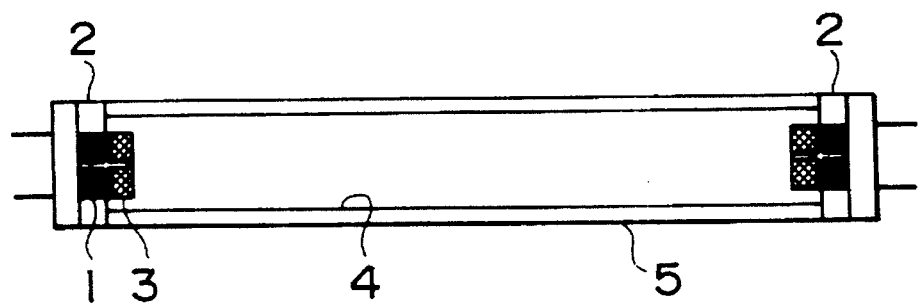
Figure 4D:
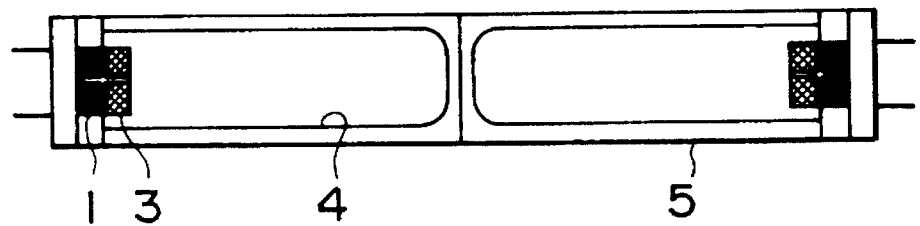
Figure 4E:
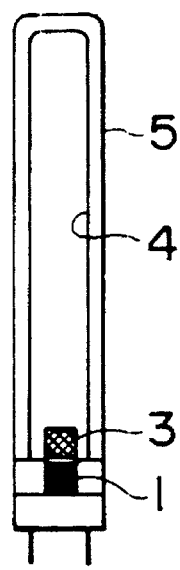
Figure 4F:
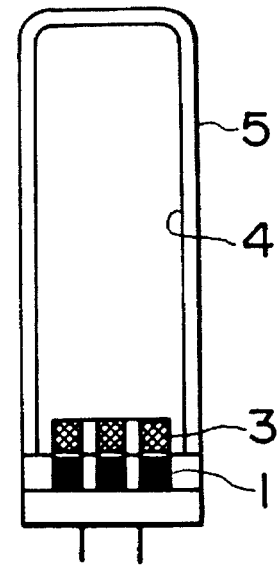
Figure 4G:
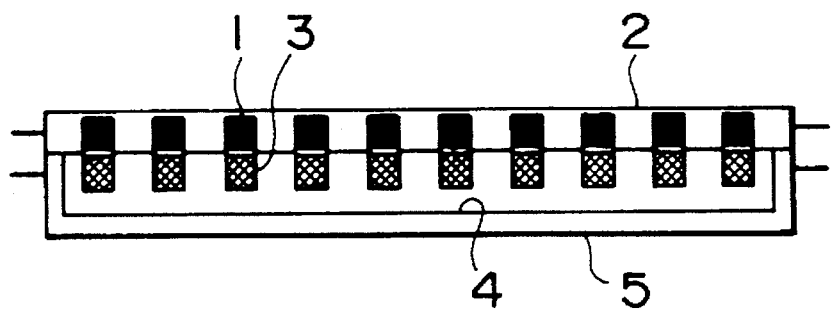

As shown in FIG. 3, in the semiconductor laser element 1 as described above, an AC or battery-powered DC power source 6 and a lighting circuit 7 are connected together. The lighting circuit 7 is provided with a current limiter resistance $R_1$ and a luminous intensity control resistance $R_2$, if necessary. When the power source 6 is an AC power source, a rectifier diode D is provided for half-wave rectification. Otherwise, after voltage is reduced to a required voltage through a transformer T, the full-wave rectification is executed by a full-wave rectifier D'. In case where a plurality of semiconductor laser elements 1 are connected in series, when one semiconductor laser element falls to light, all the FIGS. 4(c) to 4(g) show light source devices provided in the form of a fluorescent lamp, respectively, and FIGS. 4(c) and 4(d) show light source devices having terminals on both ends, while FIGS. 4(e) and 4(f) show light source devices having a terminal on one end. Further, as shown in FIG. 4(g), an elongate heat sink 2 may be provided on one side of a glass tube 5 to array a large number of semiconductor laser elements 1 and diffusion lenses 3 thereon at intervals. (Three-color superposition type)

Referring to FIG. 1(b), semiconductor laser elements 1R, 1G and 1B of three primary colors consisting of red, green and blue are buried in or mounted on a heat sink (radiator) 2, and a diffusion lens 3 is arranged in front of each semiconductor laser element 1 and superposed on a converging diffusion lens 9 through a collimator lens 8. A laser beam $L_0$ emitted from each semiconductor laser element 1 is diffused through the diffusion lens 3, then converged through the collimator lens 8 and superposed on the converging diffusion lens 9 to provide white light, which is then diffused and outputted.

The semiconductor laser elements 1 are arranged at a uniform interval on the same circumference, for example, and the diffusion lens 3 and the collimator lens 8 are arranged to make the optical axes thereof inclined. In addition, the lenses 3, 8 and 9 are made of the materials similar to those of the light source device of fluophor utilization type. Either of the convex lens and the concave lens may be used as the converging diffusion lens 9.

The crystal structures shown in Table 1 described above may be used as the crystal structure of each of the semiconductor laser elements 1R, 1G and 1B. In this case, the semiconductor laser element 1 having the following structure may be used as the semiconductor laser element 1 having a short wavelength such as blue, similarly to that of the light source device of fluophor utilization type.

Namely, a rare earth substance is doped into the active layer 100 of the semiconductor laser element 1 of 0.8 μm band or the like enabling to generate relatively high radiant power output by charging the active layer with vaporized gas of the rare earth substance at the time of producing the active layer (See FIG. 2(a)). A laser beam having a wavelength in the visible light region of each color can also be outputted by properly selecting the rare earth substance.

Further, it may be possible to obtain blue light by using the semiconductor laser element 1 of 0.8 μm band or the like enabling to generate relatively high radiant power output and the SHG (Second Harmonic Generation) element 200, similarly to the case of the light source device of fluophor utilization type (See FIG. 2 (b)).

Incidentally, the configurations of the light source device and the incorporation of the lighting circuit are similar to those of the light source device of fluophor utilization type.

Referring now to the structure and principle of the semiconductor laser element 1, the detailed description will be given in the following. As shown in FIG. 5, the semiconductor laser generally has a double hetero junction, in which the active layer (luminous layer) 100 is sandwiched between the clad layers 101 and 102 from both sides. The resultant layers are formed on a metal contact 103 and a substrate 104, while a contact layer 105, an insulating layer 106 and a metal contact 107 are laminated on the clad layer 101.

The active layer 100 is a semiconductor having a small band gap (i.e., energy difference between a valence band and a conduction band of the semiconductor), and the clad layers 101 and 102 are respectively n- and p-type semiconductors having a large band gap. When forward voltage is applied to the clad layers, electrons are flown from n-type region into the active layer 100, while holes are flown from p-type region into the active layer.

These carriers (electrons and holes) are shut up in the active layer 100 by an energy barrier caused by the band gap difference in the hetero junction. The shut-up of the carriers promotes the efficient recombination of electrons and holes to generate spontaneously-emitting light. In this stage, the situation is similar to that of the LED, and light, which is not coherent, is emitted uniformly in all the directions.

The spontaneously-emitting light promotes the subsequent recombination of electrons and holes to cause the stimulated emission. Since the end facet 100a of the active layer 100 is a cleaved facet (i.e., easily cleavable specified facet of crystal lattice) of the crystal, and plays a role of the reflection mirror of an optical resonator. Therefore, the stimulated emission and photo multiplication can proceed while light reciprocates within the optical resonator. Further, in case of the double hetero junction, since the refractive index of the active layer 100 is larger than that of each of the clad layers 101 and 102, the active layer 100 plays the role of an optical waveguide, so that the light is shut up in the active layer 100 to reduce the optical loss.

When injection current is increased to some extent, ultimately the laser oscillation is generated. At this time, the intensity of radiant power output is suddenly increased, and a laser beam having a narrow spectrum band and the directivity can be radiated from both end facets 100a. In case of AlGaAs-AlGaAs-GaAs laser, although the life thereof is slightly inferior to that of the LED, (e.g., 1,300,000 hours at 40° C. of the ambient temperature, and 270,000 hours at 40° C.), large radiant power output can be obtained (e.g., not less than 10 mW, several 100 mW at the maximum, and up to about 100 mW at a practical level).

The necessary radiant power output can be obtained by arranging a plurality of semiconductor laser elements of the basic double hetero junction as described above. However, in order to obtain higher radiant power output and higher efficiency, the following structures are adopted.

(1) A semiconductor laser of phased array type is used.

As shown in FIG. 5, the semiconductor laser of normal double hetero junction adopts the single stripe structure having a current injection region restricted by the insulating layer 106 in order to obtain a much finer oscillation mode, or much lower threshold current. When the stripe width is enlarged, the radiant power output is increased. However, when the stripe width is enlarged to not less than 10 μm, the filament-like multimode oscillation is generated to make the control of oscillation impossible, and the oscillation threshold current becomes also larger. Therefore, when the semiconductor laser having the single stripe structure is used, it is necessary to enlarge the stripe width in the range of not more than 20 μm, preferably not more than 10 μm.

Figure 6:
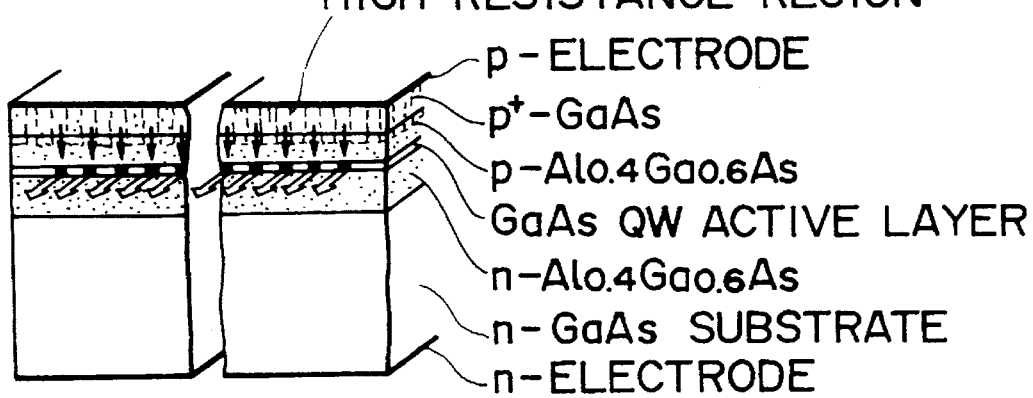
FIG. 6 is a perspective view showing the structure of a semiconductor laser element of phased array type.

Further, in order to generate higher radiant power output, use is made of a semiconductor laser of phased array type (laser of phase synchronous type), in which a wide stripe is divided into a large number of narrow stripes, as shown in FIG. 6. In case of the semiconductor laser having such the structure, the oscillation mode in each of the mutually adjacent stripes is combined, and each phase thereof is synchronized to generate the oscillation in a group, which results in high radiant power output. The semiconductor laser of phased array type is variously structured, such as that of parallel waveguide type, injection current variation type, stripe width variation type, diffraction combination type, offset stripe type or the like. Each of these semiconductor lasers can continuously oscillate to generate output of 10 to 30 W. However, for the practical use, it is preferable to control the output at 10 W from the viewpoint of the relation between the heat resistance and the life.

(2) A reflection mirror or a reflection film is provided on the end facet of the active layer.

Figure 7:
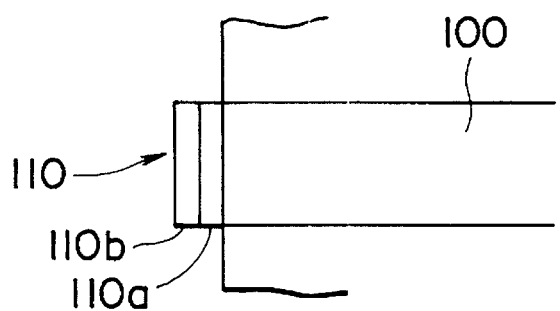
FIG. 7 is a sectional view showing a reflection member on an active layer of a semiconductor laser element.

Usually, the laser beam radiated from the cleaved facet (reflection face) on one side of the active layer 100 is mainly used as a main beam, and the laser beam radiated from the opposite side is mainly used as a monitor beam for use in the control for stabilization of the radiant output of the laser beam. As shown in FIG. 7, a reflection mirror 110 is provided on the cleaved facet on one side of the active layer 100. The reflection mirror 110 is constituted by the evaporation of silver or mercury 110b on the outside surface of quartz glass 110a.

In the condition of the cleaved facet as it is, the reflectance is about 25%. However, the reflectance is remarkably improved by the reflection mirror Up to about 90%, for example. Thus, the oscillation threshold current can be remarkably reduced, and the luminous power conversion efficiency can be improved.

(3) An optical guide layer is thickened.

Figure 8A:
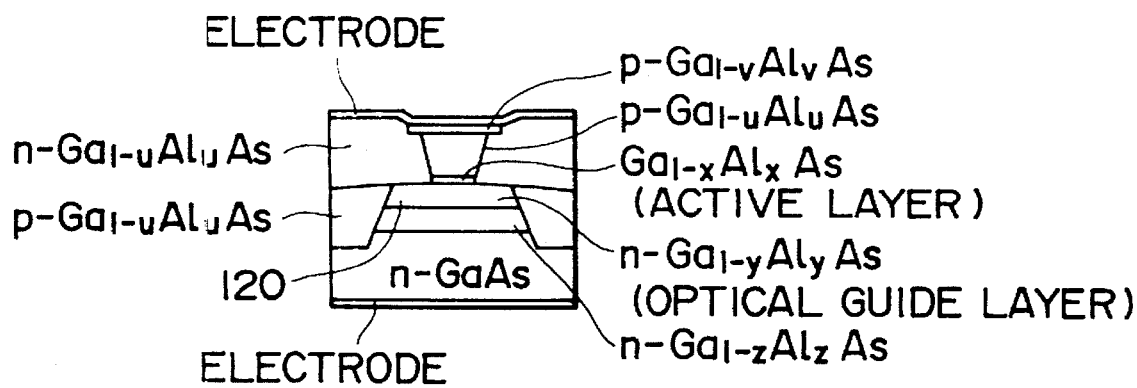
FIG. 8(a) is a schematic front view showing a semiconductor laser element provided with an optical guide layer.

As shown in FIG. 8(a), the high radiant power output is made possible by thickening an optical guide layer 120.

(4) Quantum well structure

Figure 8B:
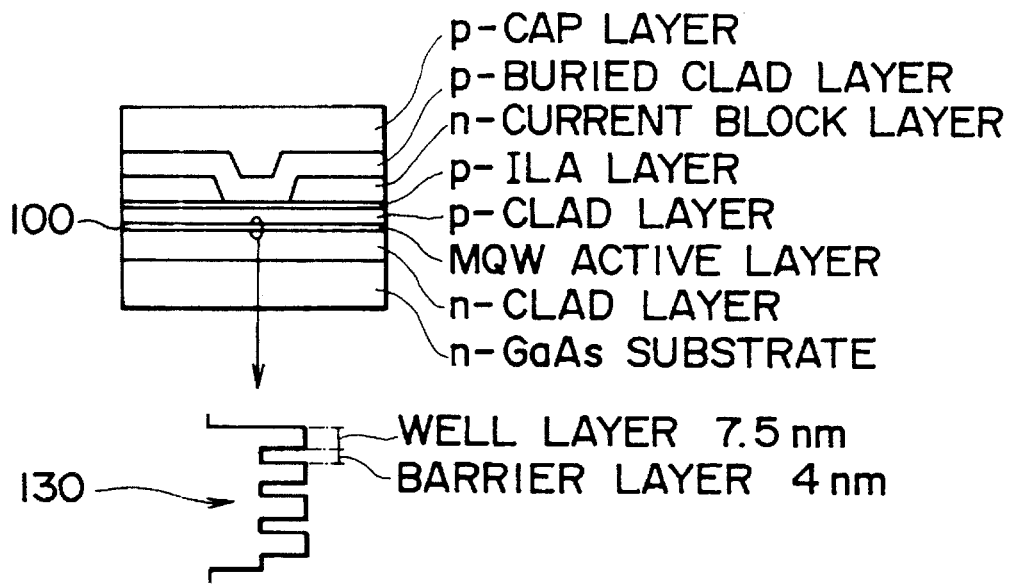
FIG. 8(b) is a schematic front view showing a semiconductor laser element having a quantum well structure.

As shown in FIG. 8(b), a quantum well 130 is formed such as to change the usual thickness of 1000 to 2000 Å of the active layer 100 into not more than 100 Å. Thus, since the energy state of the electrons can be collected efficiently to a certain wavelength band, it is possible to obtain a high performance laser having remarkably low oscillation threshold current. Further, the oscillation wavelength can be also varied only by varying the width of the quantum well.

Otherwise, a laser of plane light emission type or the like for enabling the two-dimensional array can be properly used in order to obtain the higher radiant power output of the semiconductor laser.

Incidentally, the illuminating light source device according to the present invention can be applied to flash lights, room lamps, street lamps, guide lamps, lighting in automobiles, trains, ships, airplanes, military vehicles and tunnels, underpass lamps, undersea tunnel lamps, underwater lamps, desk or floor lamps, decorative chandeliers or the like.

What is claimed is:

1. An illuminating light source device, comprising:
    a semiconductor laser element for outputting a laser beam having a particular wavelength in the range from infrared rays to ultraviolet rays;
    a diffusion lens for diffusing the laser beam from said semiconductor laser element; and
    a fluophor for converting the diffused laser beam from said diffusion lens into visible light.

2. An illuminating light source device according to claim 1, wherein the semiconductor laser element is of phased array type, in which a stripe is divided into a plurality of narrow stripes.

3. An illuminating light source device according to claim 2, wherein said semiconductor laser element has at least one cleaved facet, and wherein a reflection member is provided on the cleaved facet on one side of an active layer of the semiconductor laser element.

4. An illuminating light source device according to claim 2, wherein mercury atoms or rare earth substances are doped into the active layer of the semiconductor laser element.

5. An illuminating light source device according to claim 2, wherein a second harmonic generation medium is provided on the output side of the semiconductor laser element.

6. An illuminating light source device according to claim 1, wherein said semiconductor laser element has at least one cleaved facet, and wherein a reflection member is provided on the cleaved facet on one side of an active layer of the semiconductor laser element.

7. An illuminating light source device according to claim 6, wherein mercury atoms or rare earth substances are doped into the active layer of the semiconductor laser element.

8. An illuminating light source device according to claim 6, wherein a second harmonic generation medium is provided on the output side of the semiconductor laser element.

9. An illuminating light source device according to claim 1, wherein mercury atoms or rare earth substances are doped into the active layer of the semiconductor laser element.

10. An illuminating light source device according to claim 1, wherein a second harmonic generation medium is provided on the output side of the semiconductor laser element.

* * * * *

UNITED STATES PATENT AND TRADEMARK OFFICE
CERTIFICATE OF CORRECTION

PATENT NO. : 5,535,230
DATED : July 9, 1996
INVENTOR(S) : Tasashi Abe

It is certified that error appears in the above-identified patent and that said Letters Patent is hereby corrected as shown below:

On the title page,

[73] Assignee's name "Shogo Tzuzuki" and substitute therefor -- Shogo Tsuzuki--.

Signed and Sealed this

Twentieth Day of July, 1999

Attest:

Q. TODD DICKINSON

Attesting Officer

Acting Commissioner of Patents and Trademarks